United States Patent
Hsieh (10) Patent No.: US 7,030,020 B2
(45) Date of Patent: Apr. 18, 2006

(54) METHOD TO SHRINK CELL SIZE IN A SPLIT GATE FLASH

(75) Inventor: Chia-Ta Hsieh, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 201 days.

(21) Appl. No.: 10/661,746

(22) Filed: Sep. 12, 2003

(65) Prior Publication Data

US 2005/0059249 A1     Mar. 17, 2005

(51) Int. Cl.
*H01L 21/311*     (2006.01)

(52) U.S. Cl. ............... 438/694; 438/719; 438/723; 438/724; 438/753; 438/756; 438/757; 438/770; 257/314; 257/315; 257/316

(58) Field of Classification Search .............. None
See application file for complete search history.

(56) References Cited

U.S. PATENT DOCUMENTS

| | | | |
|---|---|---|---|
| 5,643,814 A | 7/1997 | Chung | 437/43 |
| 5,915,178 A | 6/1999 | Chiang et al. | 438/266 |
| 6,159,801 A * | 12/2000 | Hsieh et al. | 438/259 |
| 6,326,660 B1 | 12/2001 | Lin et al. | 257/314 |
| 6,380,583 B1 | 4/2002 | Hsieh et al. | 257/314 |
| 6,403,494 B1 | 6/2002 | Chu et al. | 438/719 |
| 6,441,429 B1 * | 8/2002 | Hsieh et al. | 257/316 |
| 6,486,032 B1 * | 11/2002 | Lin et al. | 438/266 |

* cited by examiner

*Primary Examiner*—Nadine G. Norton
*Assistant Examiner*—Eric B. Chen
(74) *Attorney, Agent, or Firm*—Thomas, Kayden, Horstemeyer & Risley (57) ABSTRACT

A new method to form MOS gates in an integrated circuit device is achieved. The method comprises forming a dielectric layer overlying a substrate. A polysilicon layer is formed overlying the dielectric layer. A patterned masking layer with an opening is formed overlying the polysilicon layer. Through the opening, the polysilicon layer is oxidized to form a first silicon oxide layer at the bottom of the opening. Thereafter the masking layer is removed and the polysilicon layer is exposed. The exposed polysilicon layer is then etched through using the first silicon oxide layer as a mask to form MOS floating gates. The first silicon oxide layer is then removed. A second conductor layer is then deposited overlying the MOS floating gates for forming control gates.

20 Claims, 9 Drawing Sheets

METHOD TO SHRINK CELL SIZE IN A SPLIT GATE FLASH

BACKGROUND OF THE INVENTION (1) Field of the Invention

The invention relates to semiconductor memory devices, and, more particularly, to a method of forming a split gate flash memory with minimal floating gate-to-floating gate spacing.

(2) Description of the Prior Art

A split gate flash memory device is essentially a MOS transistor with a variable threshold voltage. The threshold voltage varies with the amount of charge that is stored on a floating gate structure. The floating gate structure overlies a first part of the device channel region. A control gate structure overlies a second part of the device channel region. Voltage on the control gate controls the second part of the device channel region directly and controls the first part of the device channel indirectly, as modulated by charge on the floating gate. The control gate is formed in close proximity to the floating gate so that a capacitive coupling between the control gate and the floating gate is achieved.

Flash memories have undergone significant improvements over the years. In particular, device size has been dramatically reduced. Further reductions in the device size require technological innovations. In particular, the spacing between the floating gates of adjacent split gate flash cells is a significant problem. Currently, the floating gates are patterned, or defined, using a lithographic system. For example, after the deposition of a floating gate layer, the semiconductor wafer is then coated with a photoresist layer. The photoresist layer is exposed to actinic light through a mask. After development, a pattern of photoresist is left on the wafer overlying the floating gate layer. The floating gate layer is then etched where exposed by the patterned photoresist layer.

There are several difficulties in minimizing the cell-to-cell spacing of the split gate flash cells. The floating gate spacing is often the limiting factor in the cell-to-cell spacing. If the floating gate spacing is made too small, then misalignment in the lithography process or variation in the etching process may lead to bridging or shorting of the floating gates. Alternatively, increasing the floating gate spacing will cause the floating gate overlap of active area (OD) to decrease. Misalignment or overetching could then cause the active area to be uncovered by the floating gate edge. This would result in leaky devices. Finally, methods to self-align the floating gate to the active area result in overly complicated processes or in residue issues. A primary goal of the present invention is to provide a method to reduce cell-to-cell spacing without reducing reliability or yield and without significant complexity.

Several prior art inventions relate to flash memory cells. U.S. Pat. No. 5,915,178 to Chiang et al, U.S. Pat. No. 6,380,583 B1 to Hsieh et al, U.S. Pat. No. 6,403,494 B1 to Chu et al, and U.S. Pat. No. 6,326,660 B1 to Lin et al teach methods to form split gate flash memories. An oxide layer is formed overlying a polysilicon layer. This oxide layer is used as a hard mask for etching the polysilicon layer to form floating gates. However, the oxide hard mask dimensions are the same as those of the silicon nitride opening. U.S. Pat. No. 5,643,814 to Chung describes a method of making a split gate flash memory.

SUMMARY OF THE INVENTION

A principal object of the present invention is to provide an effective and very manufacturable method to form a split gate flash memory.

A further object of the present invention is to provide a method to form closely-spaced MOS gates.

A yet further object of the present invention is to provide a method to form closely-spaced floating gates.

A yet further object of the present invention is to provide a method to form closely-spaced floating gates with minimal process complexity.

A yet further object of the present invention is to provide a method to form closely-spaced split gate flash cells.

Another further object of the present invention is to provide a unique MOS gate structure.

In accordance with the objects of this invention, a method to form MOS gates in an integrated circuit device is achieved. The method comprises forming a dielectric layer overlying a substrate. A polysilicon layer is formed overlying the dielectric layer. A silicon oxide layer is formed overlying the polysilicon layer. A masking layer is deposited overlying the silicon oxide layer. The masking layer is patterned to selectively expose the silicon oxide layer. Thereafter the polysilicon layer is oxidized to increase the thickness of the exposed silicon oxide layer. The thickened silicon oxide layer encroaches under the edges of the masking layer. The silicon oxide layer does not thicken under other interior areas of the masking layer. Thereafter the masking layer is removed. Thereafter the silicon oxide layer is etched to selectively expose the polysilicon layer where the silicon oxide layer did not thicken. Thereafter the exposed polysilicon layer is etched through to thereby form MOS gates in the manufacture of the integrated circuit device.

Also in accordance with the objects of this invention, an integrated circuit device is achieved. The device comprises a dielectric layer overlying a substrate. A patterned polysilicon layer overlies the dielectric layer. A patterned silicon oxide layer overlies the patterned polysilicon layer. The patterned silicon oxide layer is substantially thinner at external edges than at internal areas. The external edges of the patterned polysilicon layer and the patterned silicon oxide layer external edges are aligned.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form split gate flash memory. A method to form closely-spaced floating gates is described. A unique MOS gate device is illustrated. It should be clear to those experienced in the art that the present invention can be applied and extended without deviating from the scope of the present invention.

Figure 1:
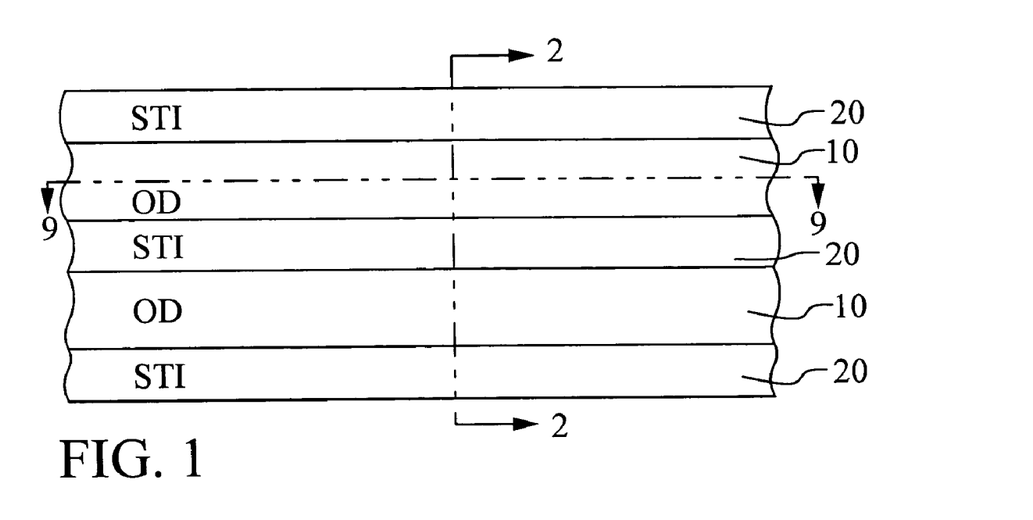
FIG. 1 illustrates a top layout view of a partially completed split gate flash device array showing a preferred embodiment of the present invention.

Referring now to FIG. 1, the preferred embodiment of the present invention is illustrated. Several important features of the present invention are shown and discussed below. A top view of a partially completed split gate flash memory of the present invention is shown. A typical flash memory comprises a very large number, perhaps millions, of identical memory cells. The cells are arranged in a two-dimensional array to facilitate addressing, reading, and writing to specific cells in the array.

In this exemplary layout, a wafer substrate 10 is provided. The substrate may comprise any suitable semiconductor material or combination of materials. Preferably, the substrate 10 comprises monocrystalline silicon. Other substrates, such as silicon on isolation (SOI), could be used. The substrate 10 is divided into two types of areas: active 10 and isolation 20. The active areas (OD) 10 are simply areas of semiconductor. The isolation areas (STI) 20 are areas where a dielectric material has been formed. The isolation areas 20 may comprise any type of dielectric material and structure suitable for isolating adjacent active devices. Preferably, the isolation areas 20 comprise shallow trench isolation (STI) that may be formed by well-known methods. Typically, STI regions 20 comprise trenches in the substrate 10 that are filled with a dielectric material such as silicon oxide. The memory array is laid out such that the STI regions 20 and active (OD) regions 10 are in parallel. Two cross sections "2" and "9" are analyzed in the description below. The "2" cross section bisects the parallel STI 20 and OD 10 regions and will illustrate the floating gate-to-floating gate spacing. The "2" cross section corresponds to FIGS. 2–7, and 8a–8b below. The "9" cross section is parallel to the STI 20 and OD 10 regions and will illustrate adjacent split gate flash cells within an active region 10. The "9" cross section corresponds to FIGS. 9–17 below.

Figure 2:
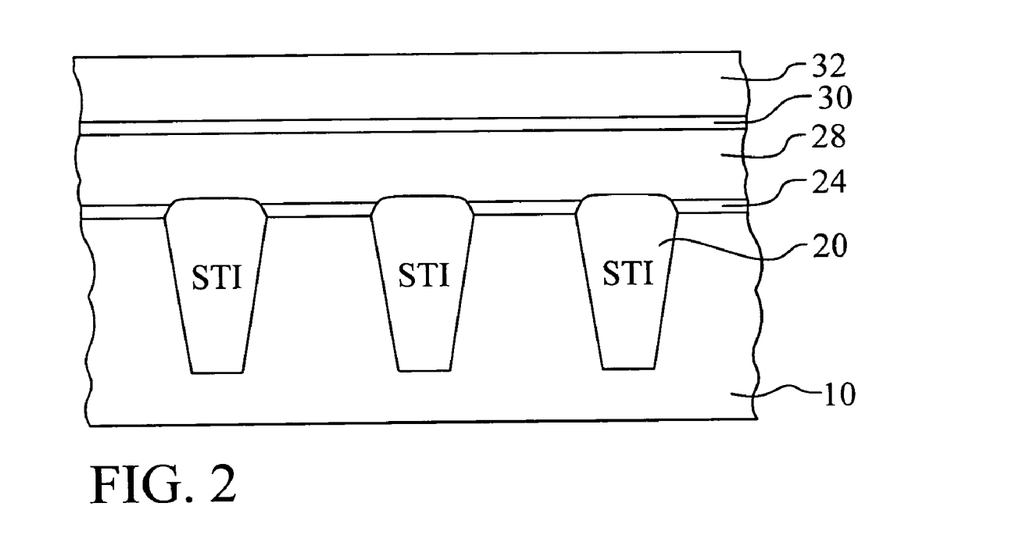
FIGS. 2–7, and 8a–8b illustrate a first cross sectional view of the split gate flash device array showing a preferred embodiment of the present invention.

Referring now to FIG. 2, the "2" cross section is illustrated. The substrate 10 is divided by a series of isolation regions 20. Each isolation regions separates an active cell area in the substrate. Several layers are formed overlying the substrate 10 and isolation regions 20. A first dielectric layer 24 is formed overlying the substrate 10 and isolation regions 20. This first dielectric layer 24 is the floating gate dielectric. The first dielectric layer 24 may comprise any dielectric layer having suitable dielectric constant and breakdown capability. Preferably, the first dielectric layer 24 comprises an oxide material. More preferably, the first dielectric layer 24 comprises silicon oxide that is thermally grown on the substrate 10 to a thickness of between about 80 Angstroms and about 110 Angstroms. For simplicity of illustration, the first dielectric layer 24 is only shown overlying the substrate 10.

A polysilicon layer 28 is then grown overlying the first dielectric layer 24. Preferably, the polysilicon layer 28 that is deposited overlying the first dielectric layer 24. The polysilicon layer 28 may be doped or undoped. More preferably, the polysilicon layer 28 is formed by chemical vapor deposition of polysilicon to a thickness of between about 600 Angstroms and about 1,200 Angstroms.

As an important feature of the present invention, a silicon oxide layer 30 is formed overlying the polysilicon layer 28. The silicon oxide layer 30 facilitates creation of a unique and very useful oxide hard mask in subsequent processing. The silicon oxide layer 30 may be deposited or thermally grown. Preferably, the silicon oxide layer 30 is thermally grown to a thickness of between about 30 Angstroms and about 100 Angstroms. As will be described below, the thickness of the silicon oxide layer 30 may be used in the present invention to control critical pattern dimensions.

A masking layer 32 is next deposited overlying the silicon oxide layer 30. The masking layer 32 is a key feature of the present invention. The masking layer 32 preferably comprises a material that can be selectively etched with respect to the silicon oxide layer 30. More preferably, the masking layer 32 comprises silicon nitride that is deposited by a chemical vapor deposition process. Most preferably, the masking layer 32 is deposited to a thickness of between about 500 Angstroms and about 1,000 Angstroms.

Figure 3:
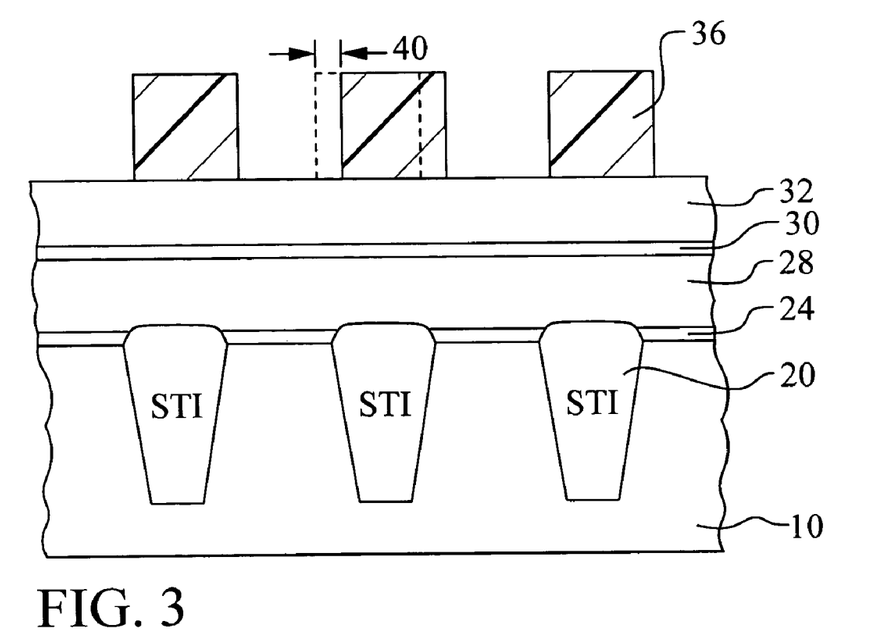

Referring now to FIG. 3, the masking layer 32 is patterned. Preferably, the masking layer 32 is patterned using a lithographic process as shown. A first photoresist layer 36 is deposited overlying the masking layer 32. The photoresist layer 36 is exposed to actinic light through a mask and then is developed. The patterned first photoresist layer 36 covers the masking layer 32 as shown. It is important to note that the resulting patterned first photoresist layer 36 may exhibit misalignment 40 as is well-known in the art.

Figure 4:
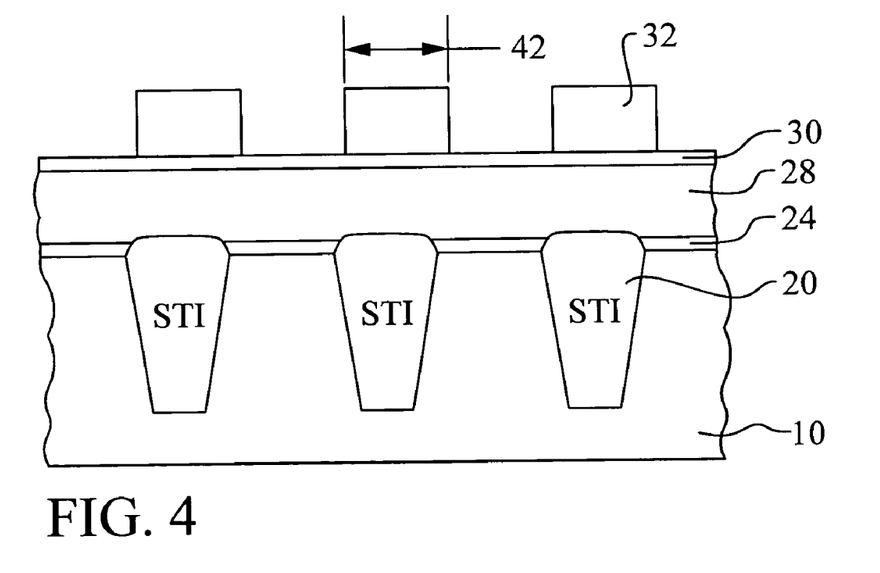

Referring now to FIG. 4, the first photoresist layer 36 pattern is transferred to the masking layer 32 by etching through the masking layer 32 where exposed by the first photoresist layer 36. The masking layer 32 is patterned to selectively expose the silicon oxide layer 30. Note that the widths 42 of the masking layer 32 features be made relatively large compared to the final floating gate-to-floating gate spacings that are formed using the unique method as will be demonstrated below.

Figure 5:
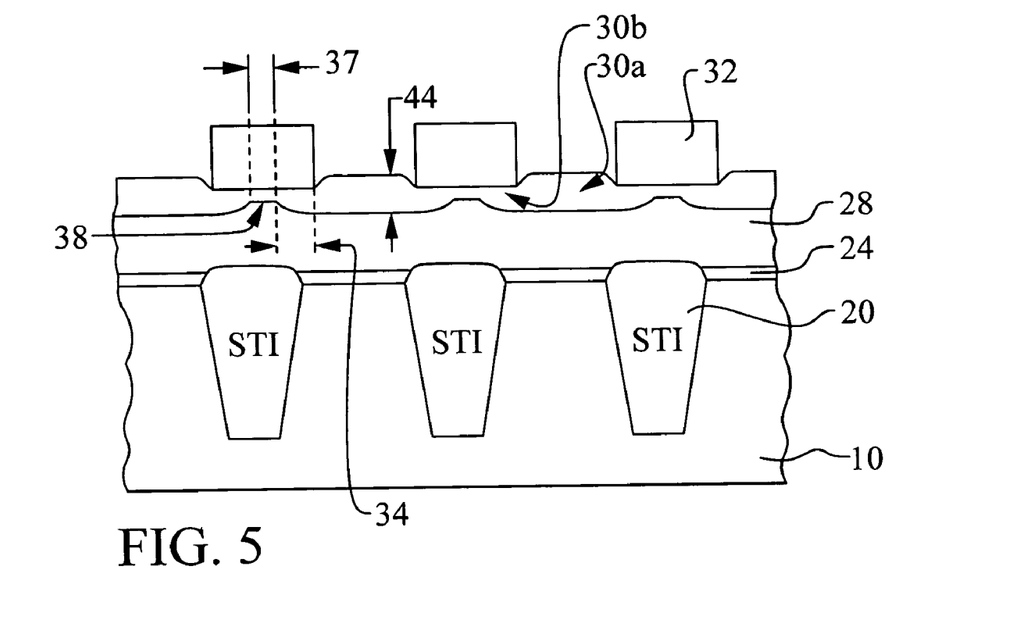

Referring now to FIG. 5, as an important feature of the present invention, the polysilicon layer 28 is oxidized to increase the thickness 44 of the exposed silicon oxide layer 30a and of the silicon oxide layer 30b underlying the edges of the masking layer. This oxidation preferably comprises a thermal oxidation process wherein part of the polysilicon layer 28 underlying the exposed areas of the silicon oxide layer 30 is converted to silicon oxide. As a result, the silicon oxide layer 30 increases in thickness 44. For example, in the exposed areas of the silicon oxide layer 30a, between about 100 Angstroms and about 300 Angstroms of additional silicon oxide is added to the final thickness 44.

At the same time, the oxidation process causes significant oxide formation in regions 30b under the edges of the masking layer 32. This phenomenon, typically called bird's beaking, causes a thickening of the silicon oxide layer 30b. In addition, the bird's beaking region encroaches under masking layer edge a considerable distance 34. It is found that the amount of bird's beak encroachment 34 under the masking layer is proportional to the initial thickness of the silicon oxide layer 30 formed in the earlier operation as illustrated in FIG. 2. A thin initial silicon oxide layer 30 creates little bird's beak encroachment 34, while a thick initial silicon oxide layer 30 creates a large bird's beak encroachment. Referring again to FIG. 5, preferably, the thermal oxidation step creates a bird's beak encroachment of between about 400 Angstroms and about 1,000 Angstroms under the edge of the masking layer 32.

In the region 38 underlying the interior of the masking layer pattern 32, the thermal oxidation step does not cause an increase in the silicon oxide layer 30 thickness. This is a key feature for two reasons. First, this region 38 of the silicon oxide layer 30 will be substantially thinner than the exposed region 30a or the bird's beak region 30b. This difference in thickness will allow the interior region 38 of the silicon oxide layer 30 to be etched through while maintaining a covering film of silicon oxide layer 30 in the bird's beak 30b and exposed 30a regions using a global etch, such as a brief oxide dip. Second, the width 37 of the interior region 38 of thin silicon oxide layer 30 can be carefully controlled based on the initial dimension of the patterned masking layer 32, the initial thickness of the silicon oxide layer 30, and the thermal oxidation time. As will be demonstrated below, a very narrow spacing can be generated that substantially exceeds the dimensional capability of the lithography system.

Figure 6:
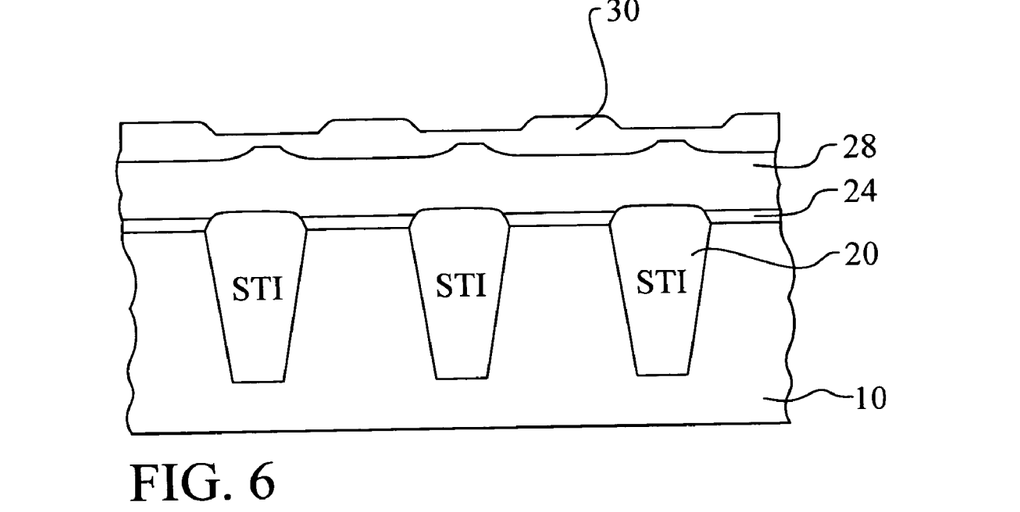

Referring now to FIG. 6, the masking layer 32 is completely removed. For example, if the masking layer 32 comprises silicon nitride, then a hot phosphoric acid dip may be used to remove the silicon nitride layer 32 without removing the silicon oxide layer 30. Alternatively, the masking layer 32 may be removed using a dry etch process as is well-known in the art.

Figure 7:
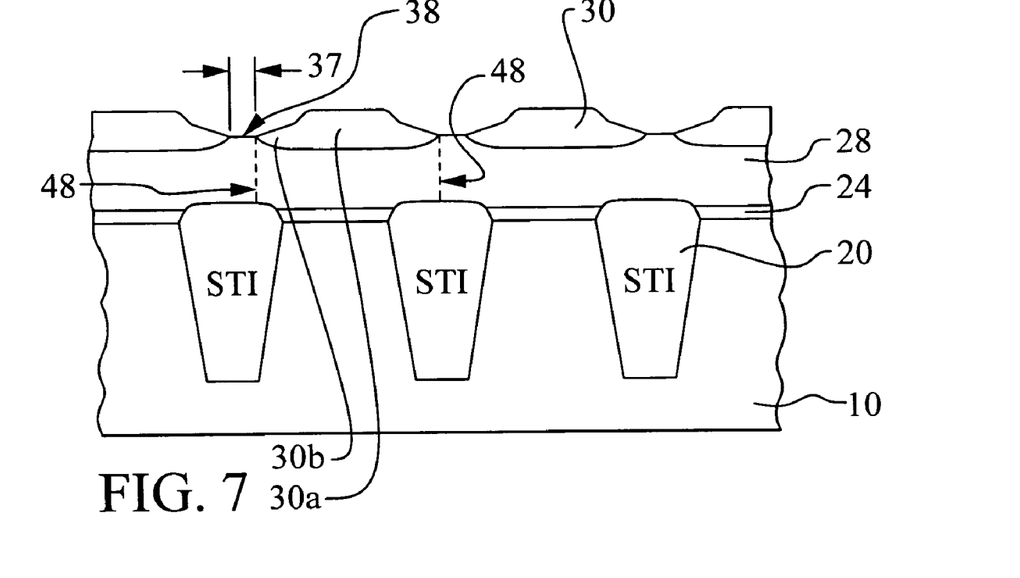

Referring now to FIG. 7, another important feature of the present invention is illustrated. The silicon oxide layer 30 is etched to selectively expose the polysilicon layer 28 in regions 38 where the silicon oxide layer 30 was not thickened in the earlier oxidation step. Preferably, a global etching process, such as an oxide dip, is used. If a brief oxide dip is performed, a thickness of the silicon oxide layer 30 will be removed from all of the wafer. The thinnest oxide, in the interior region 38 of the silicon oxide layer 30, will be etched through while a covering film of silicon oxide layer 30 will be maintained in the bird's beak region 30b and the exposed 30a region. Alternatively, a brief oxide dry etch may be performed following the masking layer 32 dry etch process to break through the thin silicon oxide layer 30 in the interior regions 38.

The etching through of the interior regions 38 of the silicon oxide layer 30 creates an oxide hard mask 30 for subsequent etching of the underlying polysilicon layer 28. It should be noted that the spaces 37 between the oxide hard mask 30 features are very small and are smaller than can be reliably attained using a lithography-only approach. By combining a conservative lithography to pattern the masking layer 32 with an oxide bird's beak encroachment, the method of the present invention allows formation of a gate hard mask 30 have very narrow spaces 37. It is also important to note that the external edges 48 of the resulting oxide hard mask 30 are designed to overlap the edges of the isolation regions 20 such that the resulting gates do not exhibit leakage. This overlap of the isolation regions 20 by the oxide hard mask 30 occurs even in the event of significant misalignment of the masking layer 32 pattern as demonstrated in the example illustrated.

Figure 8A:
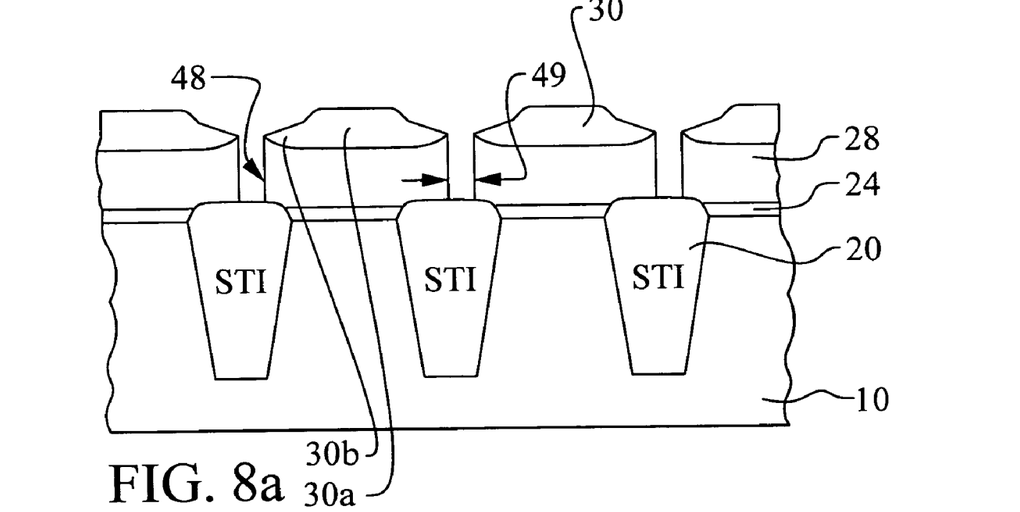

Referring now to FIG. 8a, another important feature in the present invention is illustrated. The polysilicon layer 28 is etched through where exposed by the silicon oxide layer 30. The floating gates 28 of the split gate flash device are thereby formed in the direction perpendicular to the active regions 10 as shown in FIG. 1. Referring again to FIG. 8a, the edges 48 of the floating gates 28 overlie the isolation regions 20. Very narrow floating gate-to-floating gate spaces 49 are possible with a minimally complex process and without creating shorting or leakage problems.

While the method of the present invention is optimally suited for the formation of split gate flash transistors, it can be used to pattern any MOS transistor gate 28. The resulting MOS gates 28 each comprise the polysilicon layer 28 overlying the substrate 10 with the first dielectric layer 24 therebetween. A patterned silicon oxide layer 30 overlies the patterned polysilicon layer 28. The patterned silicon oxide layer 30 is substantially thinner at external edges 30b than at internal areas 30a. The external edges 48 of the patterned polysilicon layer 28 and the patterned silicon oxide layer 30 are aligned.

Figure 8B:
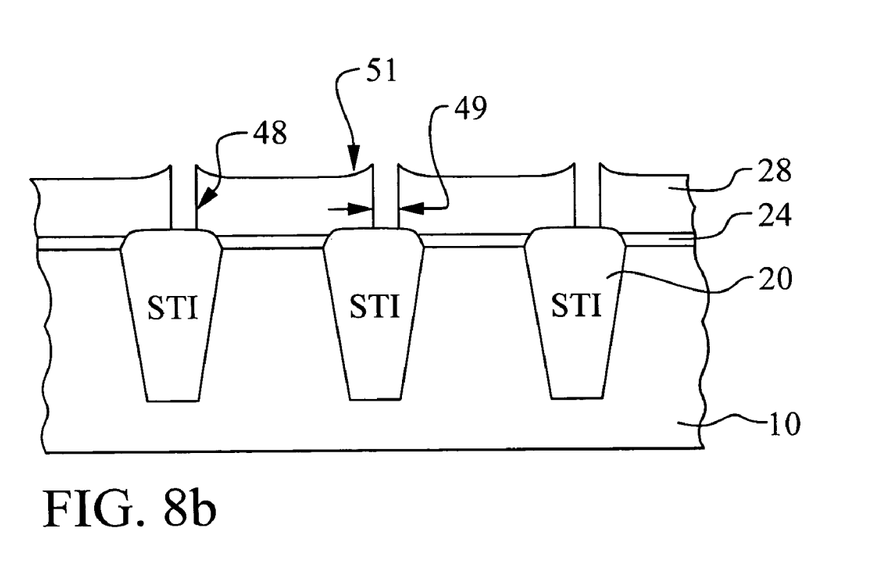

Referring now to FIG. 8b, the silicon oxide layer 30 is completely removed. The resulting flash gates 28 are illustrated. Note that the oxidation step illustrated in FIG. 5 has generated a unique topography 51 for the polysilicon layer 28 surface. As the silicon oxide layer 30 thickened, a part of the polysilicon layer 28 was consumed. With the removal of the silicon oxide layer 30 in FIG. 8b, the resulting polysilicon layer 28 has a dish-shaped cross-sectional profile.

Figure 9:
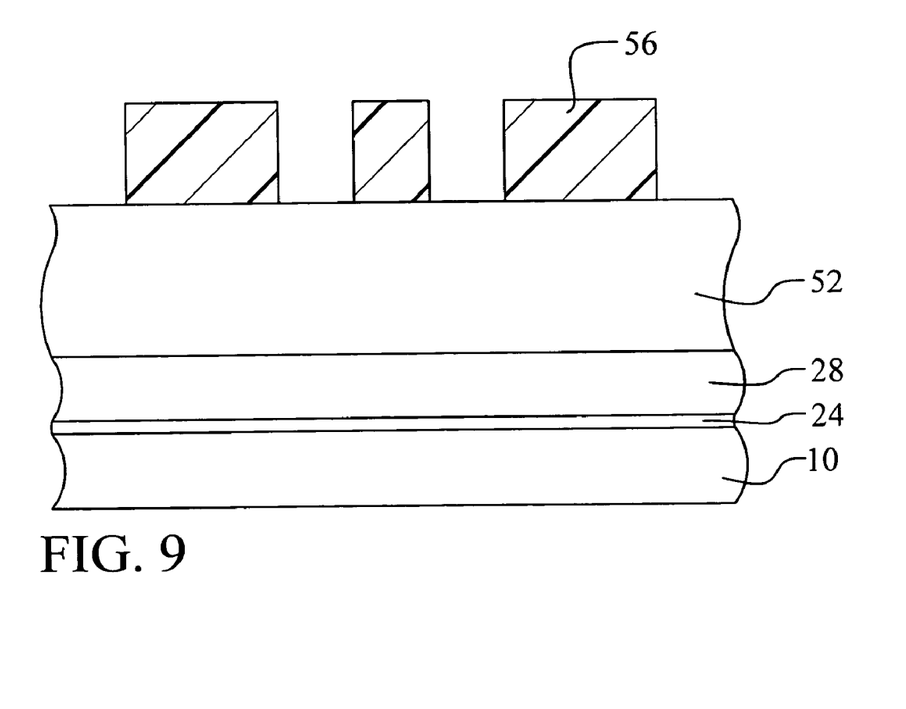
FIGS. 9–17 illustrate a second cross sectional view of the split gate flash device array showing a preferred embodiment of the present invention.

Referring now to FIG. 9, further processing in the formation of a split gate flash memory is illustrated using the "9" cross section. Note that the polysilicon layer 28 has not been defined in this direction of the array. Several steps are herein illustrated in FIGS. 9–17 to define the floating gates 28 in the active area direction, to define control gates, and to complete the memory device. Referring again to FIG. 9, a second masking layer 52 is deposited overlying the first conductor layer 28. The second masking layer 52 again preferably comprises a material, such as silicon nitride, that can be selectively etched with respect to the polysilicon layer 28 and, in addition, to oxide layers used as dielectrics in the exemplary device. More preferably, the second masking layer 52 is deposited to a thickness of between about 3,000 Angstroms and about 4,500 Angstroms. The thickness of the second masking layer 52 largely determines the height of the final device as will be seen below. The second masking layer 52 is then patterned, preferably using lithography. A second photoresist layer 56 is deposited and patterned as shown.

Figure 10:
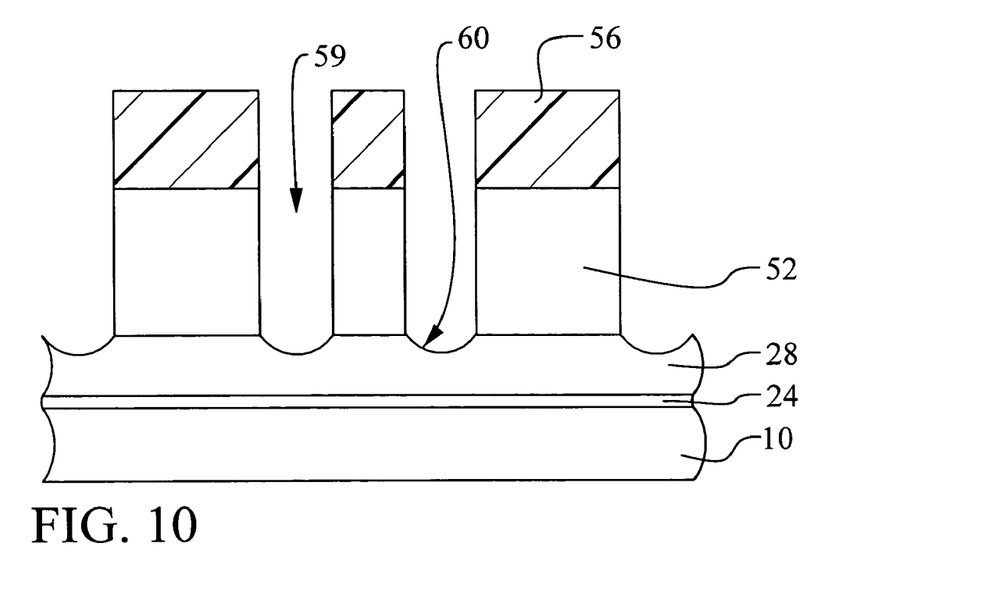

Referring now to FIG. 10, the second masking layer 52 is etched through to create openings 59. Note that an additional etch may be performed to create an optimal topography on the first conductor layer 28 as shown. In particular, by over-etching into the polysilicon layer 28, sharp corners 60 can be created at the edges of the second masking layer 52. These corners 60 or slopes improve the performance of the resulting floating gates.

Figure 11:
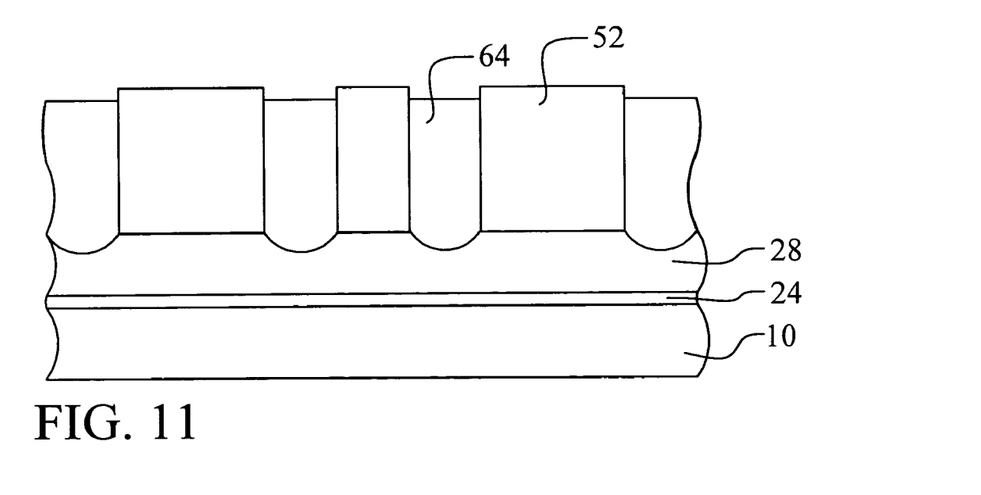

Referring now to FIG. 11, the openings 59 are filled with a dielectric material 64. Preferably, an oxide layer 64, such as silicon oxide 64, is deposited overlying the second masking layer 52 and filling the openings 59. This oxide layer 64 is then planarized using, for example, a chemical mechanical polish operation. Other planarization processes could be used.

Figure 12:
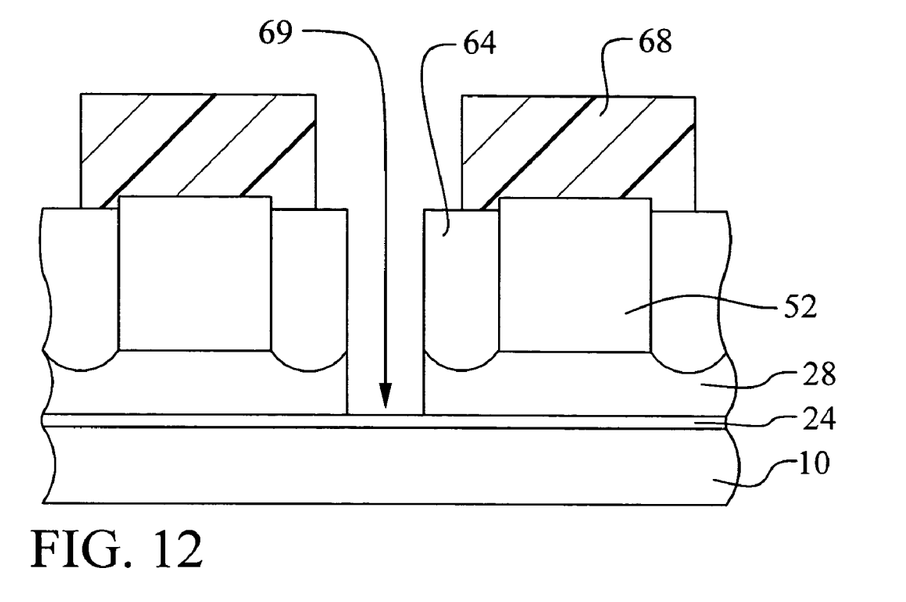

Referring now to FIG. 12, as an important feature, the floating gates are defined in the active region direction. First, another lithographic mask 68 is defined overlying the second masking layer 52 and the oxide layer 64. Next, the second masking layer 52 is selectively etched where exposed by the lithographic mask 68. Finally, the polysilicon layer 28 is etched through where exposed by a lithographic mask 68 and by the oxide layer 64. Note that this step defines the floating gates 28 in the active area direction. In addition, the edges of the floating gates 28 so defined are self-aligned to the previously formed oxide layer 64. Finally, the opening 68 that is formed serves as the source opening 68 for the completed device. Ions may be implanted through this opening to forms source regions, not shown.

Figure 13:
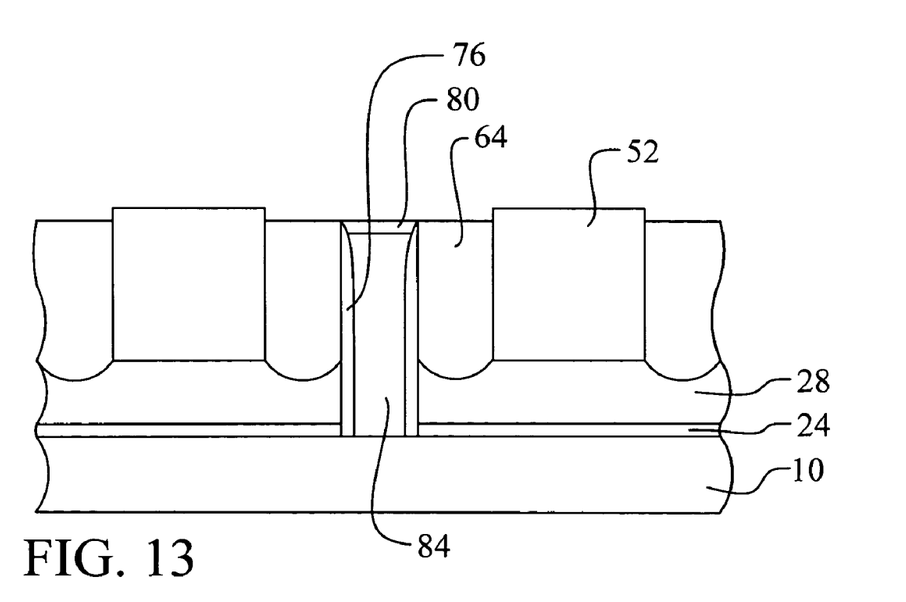

Referring now to FIG. 13, the source openings 68 are now lined with a lining oxide layer 76. Preferably, the lining oxide layer 76 is formed by first depositing silicon oxide to a thickness of between about 300 Angstroms and about 500 Angstroms and then etching back this silicon oxide to form spacers 76 lining the opening 68. Next, a conductive plug layer 84 is deposited to fill the openings 68. Preferably, the conductive plug layer 84 comprises polysilicon. The conductive plug layer 84 is then planarized using, for example, a chemical mechanical polish, to complete the source plug 84. Finally, a capping oxide layer 80 is formed overlying the conductive plug layer 84 by, for example, a thermal oxidation step.

Figure 14:
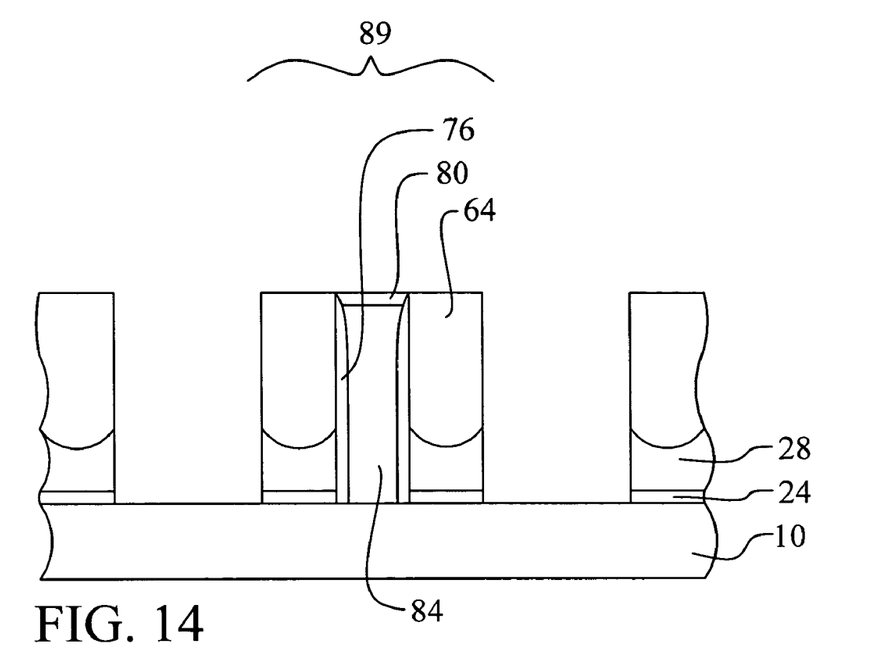

Referring now to FIG. 14, the remaining second masking layer 52 is now removed by etching. In addition, the first dielectric layer 24 is removed from the surface of the substrate 10. As a result of the processing to this point, pairs 89 of floating gates 28 are formed with source plugs 84 therebetween.

Figure 15:
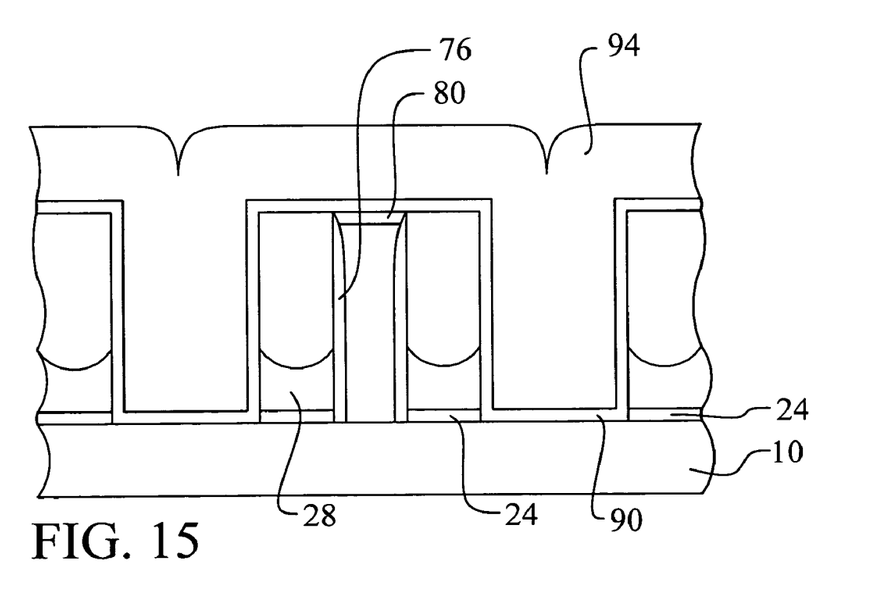

Referring now to FIG. 15, a second dielectric layer 90 is formed overlying the floating gate pair 891 and the substrate 10. The second dielectric layer 90 preferably comprises a silicon oxide layer that is formed by thermal oxidation to a thickness of between about 130 Angstroms and about 180 Angstroms. A second conductor layer 94 is then deposited overlying the second dielectric layer 90. The second conductor layer 94 will be used to form the control gates for the split gate flash devices. The second conductor layer 94 preferably comprises polysilicon that is doped or undoped. More preferably, the second conductor layer 94 is deposited to a thickness of between about 1,500 Angstroms and about 3,000 Angstroms.

Figure 16:
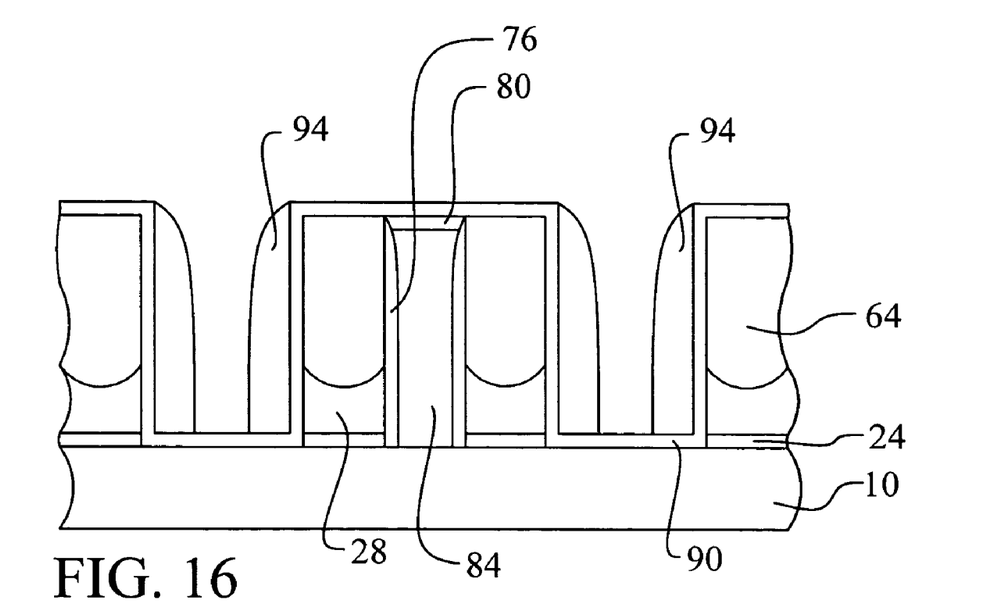

Referring now to FIG. 16, as a key feature, the second conductor layer 94 is etched back to form spacers 94 on the sidewalls of the floating gates 28, with the second dielectric layer 90 therebetween. The etching back step is preferably performed using a dry etch with an anisotropic characteristic. The resulting spacers 94 form the control gates and word lines for each side of the floating gate pairs 89.

Figure 17:
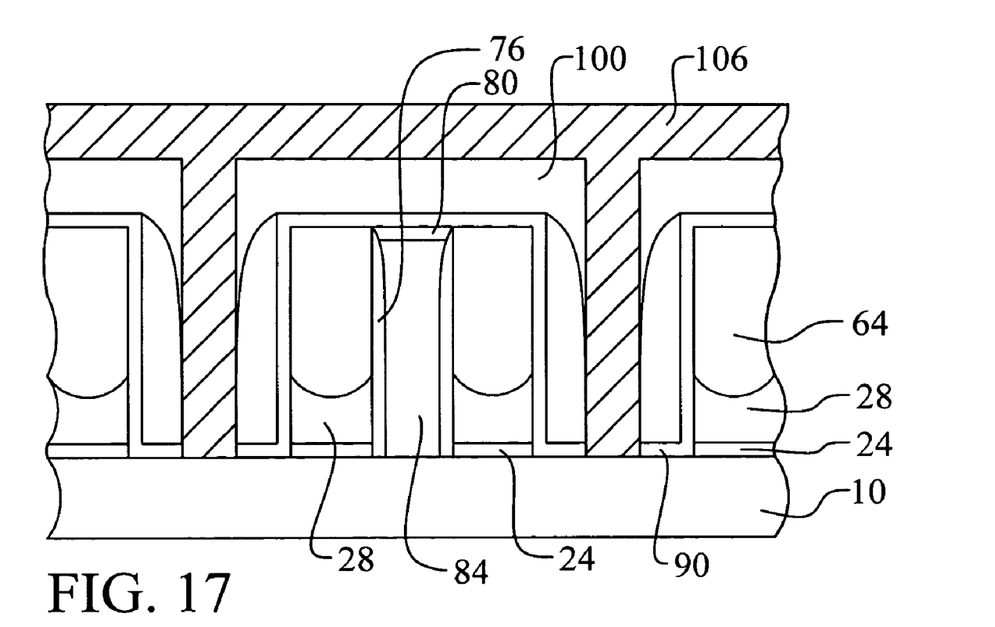

Finally, referring now to FIG. 17, the split gate flash memory device is completed. Drain regions, not shown, may be formed by ion implantation between the control gates 94. An isolation layer 100 is deposited overlying the wafer. Contact openings are made in the isolation layer 100. A metal layer 106 is deposited and patterned to form connective lines in the array.

The advantages of the present invention may now be summarized. An effective and very manufacturable method to form a split gate flash memory is achieved. The method is used to form closely-spaced MOS gates and, more particularly, closely-spaced floating gates. The method to form closely-spaced floating gates adds minimal process complexity to the base process. The floating gates so formed are incorporated into split gate flash devices. A unique MOS gate structure is achieved.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form MOS gates in an integrated circuit device comprising:
   forming a dielectric layer overlying a substrate;
   forming a polysilicon layer overlying said dielectric layer;
   forming a silicon oxide layer overlying said polysilicon layer;
   forming a patterned masking layer overlying and selectively exposing said silicon oxide layer;
   thereafter oxidizing said polysilicon layer to increase thickness of said exposed silicon oxide layer wherein said thickened silicon oxide layer encroaches under the edges of said masking layer and wherein said silicon oxide layer does not thicken under other interior areas of said masking layer;
   thereafter removing said masking layer;
   thereafter etching said silicon oxide layer to selectively expose said polysilicon layer where said silicon oxide layer did not thicken; and
   thereafter etching through said exposed polysilicon layer to thereby form MOS gates in the manufacture of said integrated circuit device
   wherein before oxidizing said polysilicon layer, said silicon oxide layer is not etched through.

2. The method according to claim 1 wherein said MOS gates comprise floating gates for split gate flash devices.

3. The method according to claim 1 wherein said step of forming a silicon oxide layer comprises thermal oxidation of said polysilicon layer.

4. The method according to claim 1 wherein said step of thereafter etching said silicon oxide layer to selectively expose said polysilicon layer comprises an oxide dip.

5. The method according to claim 1 wherein said MOS gates have a dish-shaped cross-sectional profile.

6. The method according to claim 1 wherein said masking layer comprises silicon nitride.

7. The method according to claim 1 wherein edges of said MOS gates overlie isolation structures in said substrate.

8. A method according to claim 1 further comprising:
   removing said silicon oxide layer after said step of etching through said exposed polysilicon layer;
   thereafter etching said MOS gates to selectively expose said substrate;
   thereafter forming a second dielectric layer overlying said MOS gates and said exposed substrate;
   depositing a second conductor layer overlying said second dielectric layer; and
   etching back said second conductor layer to form second MOS gates on sidewalls of said MOS gates.

9. The method according to claim 8 wherein said second MOS gates comprise control gates for split gate flash devices.

10. A method to form split gate flash devices in an integrated circuit device comprising:
    forming a dielectric layer overlying a substrate;
    forming a polysilicon layer overlying said dielectric layer;
    forming a silicon oxide layer overlying said polysilicon layer;
    forming a patterned masking layer overlying and selectively exposing said silicon oxide layer;
    thereafter oxidizing said polysilicon layer to increase thickness of said exposed silicon oxide layer wherein said thickened silicon oxide layer encroaches under the edges of said masking layer and wherein said silicon oxide layer does not thicken under other interior areas of said masking layer;
    thereafter removing said masking layer;
    thereafter etching said silicon oxide layer to selectively expose said polysilicon layer where said silicon oxide layer did not thicken;
    etching through said exposed polysilicon layer to thereby form floating gates;
    thereafter removing said silicon oxide layer;
    thereafter etching said floating gates to selectively expose said substrate;
    thereafter forming a second dielectric layer overlying said floating gates and said exposed substrate;

depositing a conductor layer overlying said second dielectric layer; and etching back said conductor layer to form control gates on sidewalls of said floating gates in the formation of said split gate flash devices in the manufacture of said integrated circuit device.

11. The method according to claim 10 wherein said step of forming a silicon oxide layer comprises thermal oxidation of said polysilicon layer.

12. The method according to claim 10 wherein said second conductor layer comprises polysilicon.

13. The method according to claim 10 wherein said step of thereafter etching said silicon oxide layer to selectively expose said polysilicon layer comprises an oxide dip.

14. The method according to claim 10 wherein said floating gates have a dish-shaped cross-sectional profile.

15. The method according to claim 10 wherein edges of said floating gates overlie isolation structures in said substrate.

16. A method to form MOS gates in an integrated circuit device comprising:

forming a dielectric layer overlying a substrate;

forming a polysilicon layer overlying said dielectric layer;

forming a patterned masking layer overlying said polysilicon layer, said patterned masking layer having an opening;

oxidizing through said opening said polysilicon layer to form a first silicon oxide layer at the bottom of said opening, wherein said first silicon oxide layer encroaches under the edges of said masking layer;

removing said masking layer after formation of said first silicon oxide layer and exposing said polysilicon layer;

etching through said exposed polysilicon layer and using said first silicon oxide layer as a mask to thereby form MOS floating gates in the manufacture of said integrated circuit device; and removing said first silicon oxide layer after said step of etching through said exposed polysilicon layer.

17. The method according to claim 16, further comprising etching said MOS floating gates to selectively expose said substrate;

forming a second dielectric layer overlying said floating MOS gates and said exposed substrate; and depositing a second conductor layer overlying said second dielectric layer for forming control gates.

18. The method according to claim 17, further comprising:

etching back said second conductor layer to form said control gates on sidewalls of said MOS floating gates.

19. The method according to claim 16, further comprising:

forming a silicon oxide layer overlying said polysilicon layer;

wherein said opening on said patterned masking layer exposes said silicon oxide layer.

20. The method according to claim 19, wherein the step of oxidizing said polysilicon layer thickens said exposed silicon oxide layer to form said first silicon oxide layer while said silicon oxide layer does not thicken under other interior areas of said patterned masking layer.

* * * * *